United States Patent [19]

Watanabe et al.

[11] Patent Number: 5,252,691
[45] Date of Patent: Oct. 12, 1993

[54] P-VINYLPHENOXYDIMETHYLPHENYL-CARBYLDIMETHYLSILANE HOMPOLYMER

[75] Inventors: Osamu Watanabe, Yokohama; Motoyuki Yamada, Kawasaki; Fujio Yagihashi, Yokohama; Minoru Takamizawa, Tokyo, all of Japan

[73] Assignee: Shin-Etsu Chemical Co., Ltd., Tokyo, Japan

[21] Appl. No.: 819,239

[22] Filed: Jan. 13, 1992

[30] Foreign Application Priority Data

Jan. 11, 1991 [JP] Japan .................................. 3-13899

[51] Int. Cl.$^5$ .................................. C08F 130/08
[52] U.S. Cl. .................................. 526/279
[58] Field of Search .................................. 526/279

[56] References Cited

U.S. PATENT DOCUMENTS 2,964,499 12/1960 Weigel .................................. 526/279

OTHER PUBLICATIONS

M. Szwarc, "'Living' Polymers," Nature, vol. 178, pp. 1168-1169 (Nov. 24, 1956).
M. Szwarc et al., "J. Am. Chem. Soc., Communications to the Editor", vol. 78, pp. 2656-2657 (Jun. 5, 1956).
T. Fujimoto et al., Polymer Journal, vol. 7, No. 3, pp. 397-401 (1975).

Primary Examiner—Christopher Henderson
Attorney, Agent, or Firm—Millen, White, Zelano & Branigan

[57] ABSTRACT

A p-vinylphenoxydimethylphenylcalbyldimethylsilane homopolymer having a molecular weight dispersion narrow enough to ensure high resolution and high developability to resists containing said homopolymer as main component can be manufactured by anionic polymerization of a p-vinylphenoxydimethylphenylcalbyldimethylsilane monomer.

1 Claim, 1 Drawing Sheet

P-VINYLPHENOXYDIMETHYLPHENYLCAR-BYLDIMETHYLSILANE HOMPOLYMER

FIELD OF THE INVENTION

This invention concerns a novel living polymer, and in particular, a p-vinylphenoxydimethylphenylcarbyldimethylsilane homopolymer useful as a functional polymer.

BACKGROUND OF THE INVENTION

Functional polymers have conventionally been widely used as resists in high resolution lithography for manufacturing LSI (large scale integrated circuits). In view of the current trends towards higher density, such resists are now being required to offer even higher resolution and higher developability. To meet these requirements, in the case of the novolak resins commonly used as resists, resolution and developability were increased by controlling the molecular weight of the polymer by means of fractionation (Japanese Tokkai Sho 62-1217542 (unexamined publication)).

Fractionation however involves a complicated procedure, and it requires a considerable time.

Recently, various chemically sensitized amplified types of resists are being studied with a view to replacing conventional resists. These resists are characterized in particular by their workability, due to the fact that they possess functional groups which can easily be eliminated by acids and to the fact that their solubility is different before and after the elimination.

From these viewpoints, styrene derivatives having excellent plasma resistance are well known, but they were unable to meet the increasingly stringent performance requirements.

Such polymers which were the main component of resists known in the art were obtained by ordinary radical polymerization or condensation polymerization, but no attempt was made to control their molecular weights or molecular weight distribution.

In this context, the Applicant carried out detailed studies of resists offering higher resolution and discovered a novel p-vinylphenoxy-dimethylphenylcarbyldimethylsilane living homopolymer having a narrow dispersion of molecular weight which led to the present invention.

SUMMARY OF THE INVENTION

It is therefore an object of this invention to provide a p-vinylphenoxydimethylphenylcarbyldimethylsilane homopolymer having a narrow dispersion of molecular weight, and which is useful as a high resolution resist.

It is a further object of this invention to provide a method of manufacturing a p-vinylphenoxydimethylphenylcarbyldimethylsilane homopolymer which can be given any desired molecular weight with a narrow dispersion.

The above objects of the invention are achieved by a polymer consisting of repeating units represented by the following structural formula (1), and a method of manufacturing said polymer:

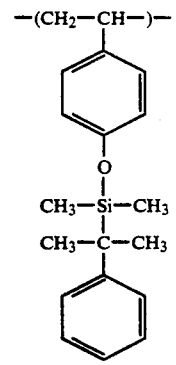

According to this invention, a polymer with a narrow molecular weight distribution can be obtained with any suitable molecular weight, and as the polymer obtained is a styrene derivative, it is extremely useful for high resolution resists.

DETAILED DESCRIPTION OF THE INVENTION

Figure 1:
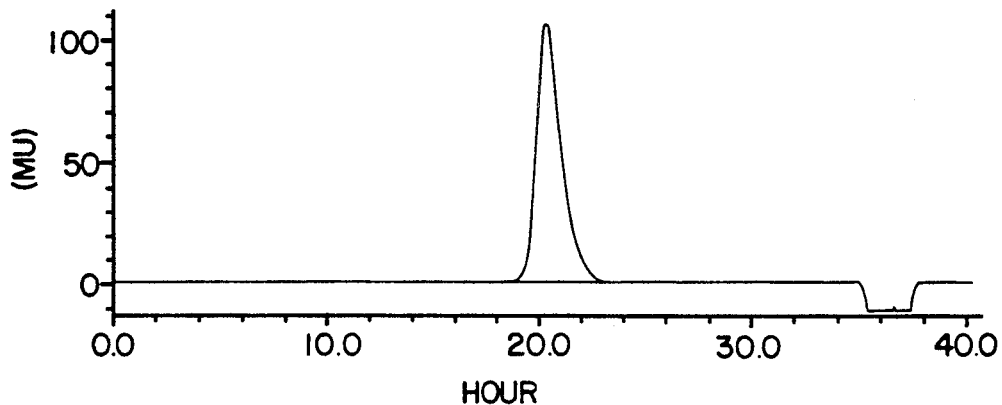
FIG. 1 shows a GPC elution curve of the living polymer of this invention obtained by the method of Example 1.

The molecular weight distribution (Mw/Mn) of the p-vinylphenoxydimethylphenylcarbyldimethylsilane homopolymer of this invention is 1.05–1.50, which is a narrow dispersion. The weight average molecular weight Mw can easily be calculated from the weight of monomer and the molarity (the number of molecules) of an initiator used.

Further, the number average molecular weight Mn can be measured by a membrane osmometer. The molecular structure can easily be verified by the infrared absorption (IR) spectrum and $^1$H-NMR spectrum, and the molecular weight distribution can be measured by performing gel permeation chromatography (GPC).

Next, we will describe in detail the method of manufacturing the polymer of this invention. The polymer of this invention is obtained by polymerizing, using a living initiator, the p-vinylphenoxydimethylphenylcarbyldimethylsilane represented by the following structural formula:

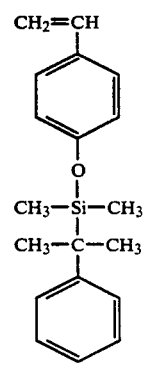

The polymer of this invention thereby obtained is therefore normally a living polymer.

The aforesaid polymer may be manufactured and purified by any of the known methods.

The living anionic initiators used in this invention may be conveniently selected from those known in the art, but organometal compounds are particularly to be preferred.

The organometal compound used as a living anionic initiator may be an organoalkali metal such as n-butyl lithium, sec-butyl lithium, tert-butyl lithium, naphtyl sodium, potassium naphthalene, anthryl sodium, disodium α-methylstyrene tetramer, cumyl potassium and cumyl cesium.

The aforesaid polymerization is normally conducted in an organic solvent. Examples of organic solvents that can be used are aromatic hydrocarbons, cyclic ethers and aliphatic hydrocarbons (e.g., benzene, toluene, tetrahydrofuran, dioxane, tetrahydropyran, dimethoxyethane, n-hexane and cyclohexane). These organic solvents are used either alone or in combination, but tetrahydrofuran is particularly preferable. The concentration of monomer used in the polymerization is 1–30 wt %, and the reaction is carried out with stirring under high vacuum or in an atmosphere of an inert gas such as argon or nitrogen. The reaction temperature can be set to any temperature from $-78°$ C. to the boiling point of the solvent used. However, when tetrahydrofuran is used as solvent the temperature preferably lies in the range $-78°$ C.–$0°$ C., while when benzene is used it is preferably room temperature.

By carrying out the reaction over a period of approx. 10 minutes–5 hours under the aforesaid conditions, the vinyl groups polymerize selectively. Next, a polymerization terminator such as methanol, water or methyl bromide is added to the reaction system to stop the reaction. In this way, a p-vinylphenoxydimethlyphenylcarbyldimethylsilane homopolymer having the following repeating units can be obtained;

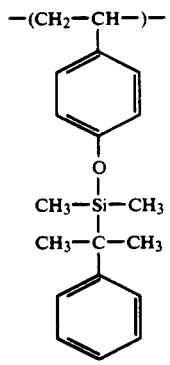

The reaction mixture thus obtained can then be precipitated with a suitable solvent, for example methanol, and the product washed and dried to purify and separate the p-vinylphenoxydimethylphenylcarbyldimethylsilane homopolymer of this invention.

In the polymerization reaction of this invention, 100% of the monomer reacts so the yield of polymer is approx. 100%. The molecular weight of the polymer obtained can thus be suitably adjusted by adjusting the quantity of monomer and the molarity of the reaction initiator.

The invention will now be described in more detail with reference to specific examples, but it should be understood that the invention is in no way limited to them.

EXAMPLE 1

$C_6H_5(CH_3)_2C(CH_3)_2SiCl$ and the molar equivalent of p-vinylphenol were introduced into a reaction vessel, and reacted at room temperature for 6 hours in dimethylformamide solvent in the presence of imidazole. The reaction product was distilled under reduced pressure to give p-vinylphenoxydimethylphenylcarbyldimethylsilane in 70% yield.

The p-vinylphenoxydimethylphenylcarbyl-dimethylsilane obtained had a boiling point of 130° C. at 0.1 mm Hg.

This monomer was then treated with $CaH_2$ and sodium benzophenonate to remove water and other impurities, and then distilled. Next, 550 ml of tetrahydrofuran solvent and $2.5 \times 10^{-4}$ moles of n-butyl lithium as initiator were introduced into a 1 liter flask, the flask was cooled to $-78°$ C., and 25 g of p-vinylphenoxydimethylphenylcarbyldimethylsilane diluted in 50 ml tetrahydrofuran was added and polymerized for 1 hour. The reaction liquid was red in color.

Methanol was added to the reaction liquid to stop the reaction, and the reaction mixture was poured into methanol to precipitate the polymer which was separated and dried. 24.5 g of a white polymer was obtained.

The $^1$H-NMR spectrum of this polymer was as described below, and its GPC elution curve was as shown in FIG. 1.

| $^1$H-NMR | |
|---|---|
| 0.0 ppm | Reference (S, 6H, O—Si—CH$_3$) |
| 1–2 ppm | (broad, 6H, Si—C—CH$_3$) |
| 1–2 ppm | (broad, 3H, CH$_2$—CH) |
| 6–7 ppm | (broad, 5H, Si—C—C$_6$H$_5$) |
| 6–7 ppm | (broad, 4H, C$_6$H$_5$) |

From the IR spectrum and $^1$H-NMR spectrum, it was verified that reactive terminal sites on the dimethylphenylcarbyl-dimethylsilane group bonded to ether had not reacted, and only the vinyl groups on the styrene fragment had reacted. The number average molecular weight of the polymer was found by membrane osmosis to be $11 \times 10^4$ g/mole, and it was also verified from the GPC elution curve that the molecular weight was very close to a monodispersion (i.e., it was a narrow dispersion).

EXAMPLE 2

1 liter of tetrahydrofuran solvent and $1 \times 10^{-3}$ moles of potassium naphthalene as initiator were introduced into a 2 liter flask. Then 35 g of p-vinylpheno xydimethylphenylcarbyl-dimethylsilane diluted in 100 ml of tetrahydrofuran at $-78°$ C. the p-vinylpheno xydimethylcarbyl-dimethylsilane having been purified as in Example 1, was added to this mixture and polymerized for 3 hours. The reaction liquid was red in color.

Methanol was added to the reaction liquid to stop the reaction, and the reaction mixture was poured into methanol to precipitate the polymer which was separated and dried. 24.5 g of a white polymer was obtained.

Figure 2:
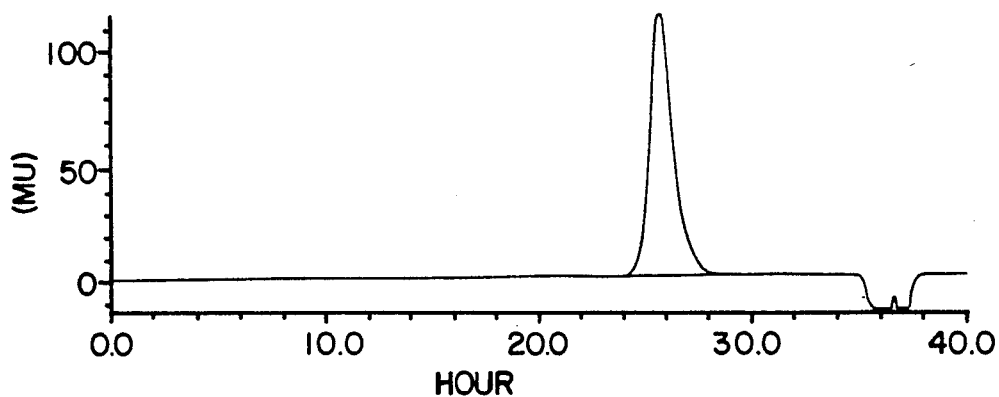
FIG. 2 shows a GPC elution curve of the living polymer of this invention obtained by the method of Example 2.

The IR and $^1$H-NMR spectrum of this polymer showed the same specific absorptions as in Example 1, and its GPC elution curve was as shown in FIG. 2.

What is claimed:

1. A p-vinylphenoxydimethylphenylcarbyldimethylsilane homopolymer, the repeating units of which consist of units represented by formula (1):
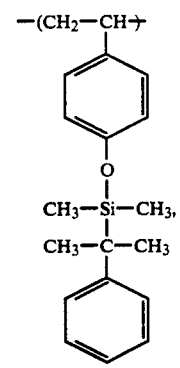
wherein said homopolymer has a ratio of weight average molecular weight to number average molecular weight of 1.05–1.50.
* * * * *